(12) United States Patent
Pan et al.

(10) Patent No.: US 8,778,602 B2
(45) Date of Patent: Jul. 15, 2014

(54) SINGLE PHOTORESIST APPROACH FOR HIGH CHALLENGE PHOTO PROCESS

(75) Inventors: Hung-Ting Pan, Pingtung (TW); Jing-Huan Chen, Jiandong Township, Pingtung County (TW); Wei-Chung Ma, Tainan (TW); Hsin-Chun Chiang, Shanhua Township, Tainan County (TW); Po-Chung Cheng, Zhongpu Shiang (TW); Szu-An Wu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 473 days.

(21) Appl. No.: 12/562,248

(22) Filed: Sep. 18, 2009

(65) Prior Publication Data

US 2011/0070546 A1    Mar. 24, 2011

(51) Int. Cl.
*G03F 7/30* (2006.01)

(52) U.S. Cl.
USPC .......................................... 430/325; 430/322

(58) Field of Classification Search
USPC ........................................ 430/311, 330, 331
See application file for complete search history.

(56) References Cited

U.S. PATENT DOCUMENTS 6,132,940 A * 10/2000 Mih et al. ..................... 430/394

\* cited by examiner

*Primary Examiner* — Kathleen Duda
(74) *Attorney, Agent, or Firm* — Haynes and Boone, LLP

(57) ABSTRACT

A method of lithography patterning includes coating a resist layer on a substrate; performing an exposing process to the resist layer using a lithography tool with a numerical aperture tuned between about 0.5 and about 0.6; baking the resist layer; thereafter performing a first developing process to the resist layer for a first period of time; and performing a second developing process to the resist layer for a second period of time.

18 Claims, 2 Drawing Sheets

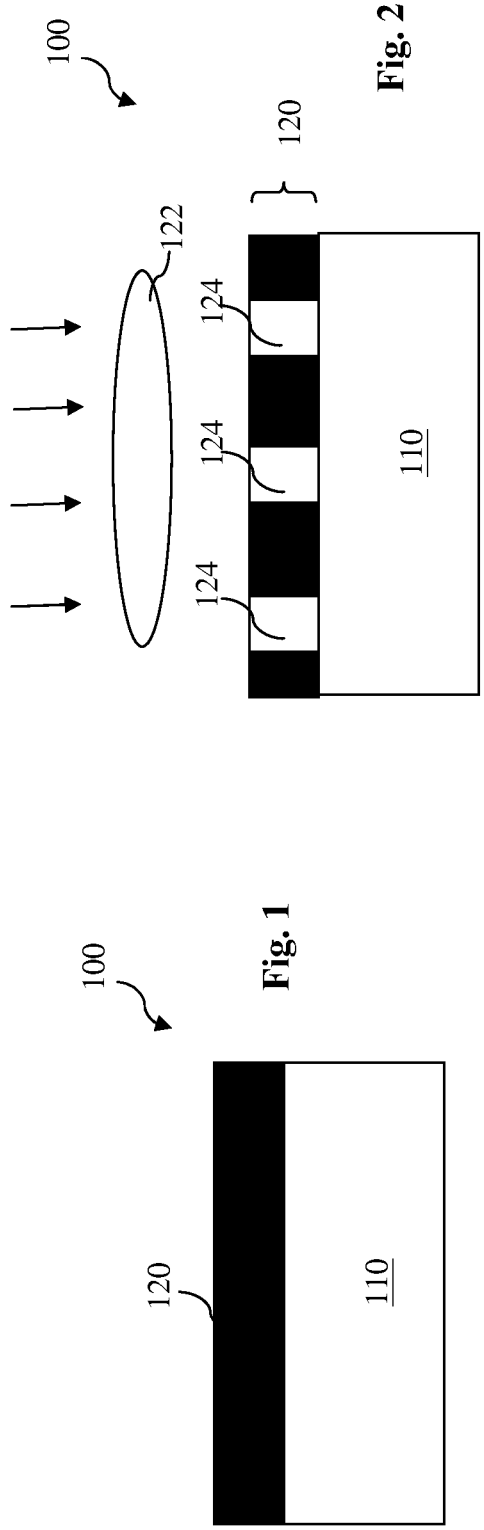
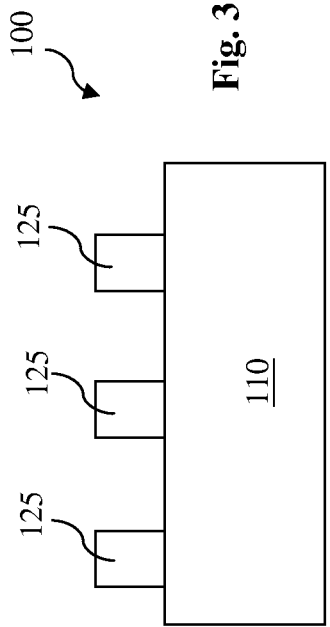

SINGLE PHOTORESIST APPROACH FOR HIGH CHALLENGE PHOTO PROCESS

BACKGROUND

When the semiconductor technologies are continually progressing to smaller feature sizes, a patterned resist layer is used to produce such small size features. Maintaining a desired critical dimension (CD) can be very difficult for various reasons. The current photoresist (or resist) is capable of achieving a low numerical aperture (NA), low post-exposure baking (PEB) such as 130 C, and single puddle developing. Furthermore, when the feature size is reduced in the advanced technology nodes, the resist has a thickness more than 25,000 angstrom and aspect ration of 15 or higher. The existing resist may have acceptable performance at the aspect ratio up to about 10 and cannot meet the criteria of the resist with aspect ratio 15 or higher. For example, the patterned resist in the existing technology could suffer seriously top loss and scum issues, causing rounding profile and bridging.

SUMMARY

One of the broader forms of an embodiment involves a method of lithography patterning. The method includes coating a resist layer on a substrate; performing an exposing process to the resist layer using a lithography tool with a numerical aperture tuned between about 0.5 and about 0.6; thereafter baking the resist layer; performing a first developing process to the resist layer for a first period of time; and performing a second developing process to the resist layer for a second period of time.

Another one of the broader forms of an embodiment involves a method of lithography patterning. The method includes coating on a substrate a resist layer having an increased acid labile unit ratio such that a resist dissolving rate is reduced to a range between about 0.01 and about 0.05 nm/sec; performing an exposing process to the resist layer using a lithography tool with a numerical aperture tuned between about 0.5 and about 0.6; thereafter baking the resist layer; and performing a two-cycle developing process to the resist layer with a total processing time more than about 50 seconds.

Yet another one of the broader forms of an embodiment involves a method of lithography patterning. The method includes coating a resist layer on a substrate; performing an exposing process to the resist layer using a lithography tool with a numerical aperture tuned between about 0.5 and about 0.6; thereafter baking the resist layer at a temperature ranging between about 135° C. and about 150° C.; thereafter performing a first developing process to the resist layer for about 30 seconds; and performing a second developing process to the resist layer for about 30 seconds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, and 3 illustrate sectional views of an embodiment of a substrate during various fabrication stages.

DETAILED DESCRIPTION

Figure 4:
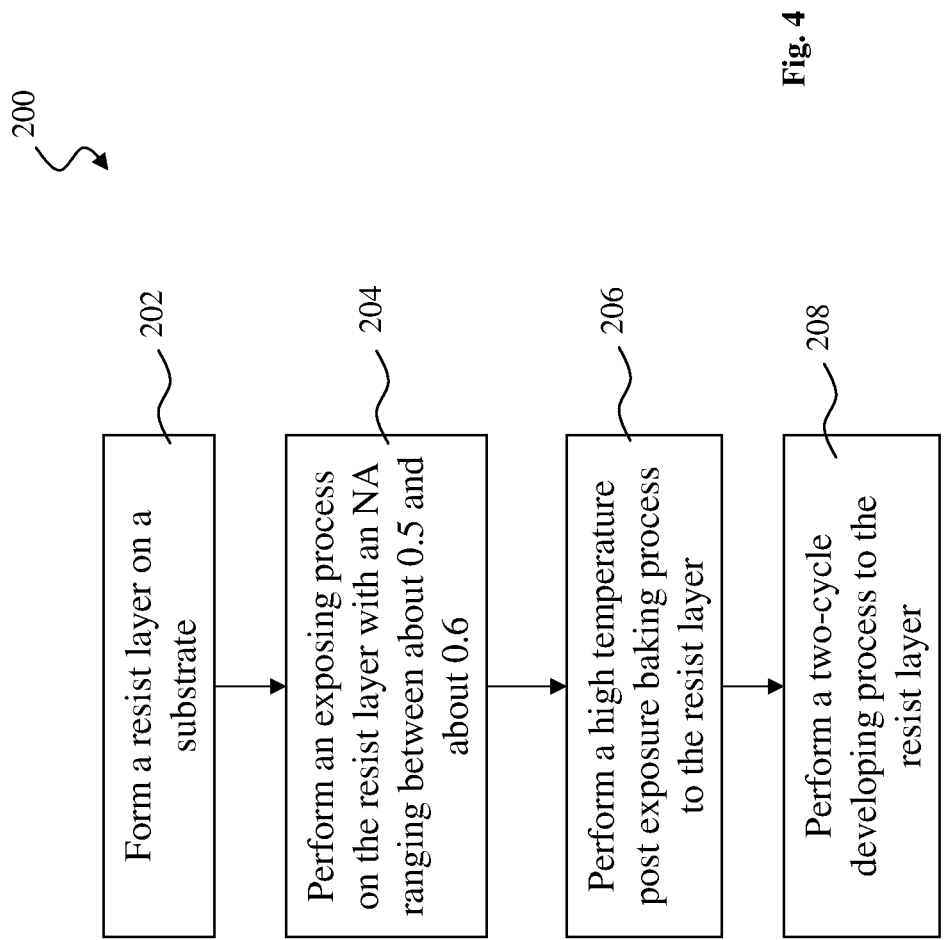
FIG. 4 is a flowchart of an embodiment of a lithography patterning method.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1-3 are sectional views of a semiconductor device 100 during various fabrication stages according to one or more embodiments. FIG. 4 is a flowchart of a method 200 of lithography patterning constructed according to aspects of the present disclosure. With reference to FIGS. 1-4, the semiconductor device 100 and the method 200, respectively, for lithography patterning the semiconductor device are collectively described.

Referring to FIGS. 1 and 4, the method 200 begins at step 202 by forming a photoresist (or resist) layer 120 on a substrate 110. The substrate 110 includes silicon. In present embodiment, the substrate 110 is a semiconductor wafer. The substrate 110 may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), and gallium indium phosphide (GaInP). The substrate 110 includes other features formed before implementing the method 200 or thereafter. For example, the substrate 110 includes various doped features, such as source, drain, and well features. The substrate 110 also includes various dielectric features, such as shallow trench isolation (STI). The substrate 110 also includes various conductive features, such as gate electrodes and multilevel interconnects. The substrate 110 may alternatively be a non-semiconductor material such as a glass substrate for thin-film-transistor liquid crystal display (TFT-LCD) devices.

The substrate 110 may further include a material layer (not shown) to be patterned by the lithography patterning process of the method 200 in conjunction with other proper subsequent semiconductor processing step, such as etching or ion implantation. The material layer may be a semiconductor layer, such as an epi silicon layer or a polycrystalline silicon (or polysilicon) layer. The material layer may alternatively include a dielectric layer or a conductive layer to be patterned to form various functional features, such as isolation features or interconnection features. The material layer may include a silicon nitride or other suitable material layer to be patterned to function as a hard mask for selective etching, ion implanting, or thermal oxidation.

The resist layer 120 is formed on the substrate 110 by a suitable method, such as spin-coating. The resist layer 120 may be further soft-baked to reduce the solvent in the resist layer. The resist layer 120 may have a thickness more than 25,000 angstroms. In one embodiment, the resist layer 120 is a positive-type resist. In another embodiment, the resist layer 120 is a negative-type resist. Other material layers, such as a bottom anti-reflective coating layer (BARC) and/or a top anti-reflective coating layer (TAR) may be formed underlying and overlying the resist layer, respectively.

For advanced semiconductor patterning using a deep ultra violet (DUV) radiation beam, the resist layer 120 may use chemical amplification (CA) resist. The resist layer 120 includes photo-acid generator (PAG) such that acid can be generated when a light beam is radiated on the resist layer 120. In one embodiment, when a 248 nm light source is utilized for the exposing process, the PAG can be ionic type (onium salt), such as metallic or sulfonate. The PAG may alternatively be non-ionic, such as sulfonate ester, 2 nitrobenzyl ester, organohalide, aromatic sulfonate, oxime sulfonate, N— sulfonyloxyimide, sulfonloxy ketone, or diazonaphthoquinone (DNQ) 4 sulfonate. The non-ionic PAG may include sulfonate, such as disulfone, ketsulfonate, or sulfonyldiazomethane. In another embodiment, when a 193 nm light source is utilized for the exposing process, the PAG may include functional group $CF_3(CF_2)_3SO_3-$, $CF_3(CF_2)_7SO_3-$, $CF_3SO_3-$, or one or more types of the chemical groups. The resist layer 120 further includes polymeric material as matrix to resist etching or implanting. The resist layer 120 also include solvent for proper lithography processing.

In one embodiment, the resist layer 120 includes acid labile units with an increased acid labile ratio such that the resist dissolving rate is tuned down to a range between about 0.01 nm/sec and about 0.05 nm/sec. In another embodiment, the resist layer 120 includes a higher bulky buffer loading level to constrain the PAG. For example, the bulky buffer loading level ranges between about 100% and about 175%. In another embodiment, the resist layer 120 includes hydrophobic macromolecular buffer to control pH value of the coated resist layer and restrain the photo-acid reaction. In one embodiment, a soft baking may be applied to the resist layer after the coating of the resist layer.

Referring to FIGS. 2 and 4, the method 200 proceeds to step 204 by performing a exposing process to the resist layer 120 with an numerical aperture (NA) ranging between about 0.5 and about 0.6. The exposing process uses a photomask (or mask) having a predefined pattern. For illustration, the exposing process may be carried out by exposing the semiconductor device 100 under a radiation beam through the mask having the predefined pattern. The radiation beam may be ultra-violet (UV) or EUV, such as a 248 nm beam by krypton fluoride (KrF) excimer lasers, a 193 nm beam by argon fluoride (ArF) excimer lasers, or a 157 nm beam by fluoride ($F_2$) excimer lasers. The exposing process is implemented in a lithography procedure that may further include mask aligning. The exposing process is implemented in a lithography apparatus having an optical module 122 capable of tuning the NA to a range between about 0.5 and about 0.6 such that the exposing process has an enlarged processing window to achieve scum free and targeted critical dimension (CD). The exposing process applied to the resist layer 120 forms exposed resist regions 124 defined by the pattern of the mask.

Referring to FIGS. 2 and 4, the method 200 proceeds to step 206 by performing a high temperature post exposure baking (PEB) process to the exposed resist layer 120. In one embodiment, the PEB process has an increased baking temperature greater than about 135° C. In another embodiment, the baking temperature of the PEB process ranges between about 135° C. and about 150° C.

Referring to FIGS. 3 and 4, the method 200 proceeds to step 208 by performing a two-cycle developing process (double puddle) to the resist layer 120 with the total processing time greater than 50 seconds. In one embodiment, the total processing time of the two-cycle developing process ranges between about 50 seconds and about 70 seconds. The two-cycle developing process includes a first developing process for a first period of time and then a second developing process for a second period of time. In one embodiment, the first period of time and second period of time each is about 30 seconds. In one embodiment, each cycle of the developing process includes applying a developing solution to the resist layer 120 and thereafter applying a cleaning solution, such as de-ionized water (DIW or DI water) to the resist layer 120. The total processing time for each cycle is about 30 seconds or longer in one example.

The two-cycle developing process forms a patterned resist layer 125. The patterned resist layer 125 defines one or more openings such that the substrate 110 is uncovered within the openings. The openings of the patterned resist layer 125 are configured according to the pre-designed pattern in the mask.

Thus formed patterned resist layer 125 can achieve a high aspect ratio, such as 15 or greater. This is critical to form high resolution pattern, especially when the semiconductor technology advances to technology nodes with small feature sizes, such as 65 nm, 45 nm or 32 nm. When the resist layer has a thickness greater than 25,000 angstroms, a resist pattern with a high aspect ratio is more expected. One or more other advantages or benefits may be realized by implementing the disclosed method in various embodiments. For example, the disclosed method to form a patterned resist layer can eliminate or reduce resist scum and/or resist pattern top loss.

The disclosed method has various embodiments each implementing different features described with FIGS. 1 through 4. In one embodiment, the method includes performing an exposing process to a coated resist layer with a numerical aperture ranging between about 0.5 and about 0.6, performing a high temperature post exposure baking to the resist layer at a temperature greater than 135 C, and performing a double puddle developing process to the resist layer. In another embodiment, the method includes coating on a substrate a resist layer having increased acid labile unit and performing an exposing process to a coated resist layer with a numerical aperture ranging between about 0.5 and about 0.6 A. The resist layer may further include higher bulky buffer loading level ranging between about 100% and about 175% to control PAG for better patterned resist profile, such as reduced top loss. The resist layer may further include higher hydrophobic macromolecular buffer to control pH value of the resist layer. The method may further include performing a high temperature post exposure baking to the resist layer at a temperature greater than 135 C, and performing a double puddle developing process to the resist layer.

Other steps may be implemented before, during or after the disclosed method. For example, a hard baking process may be implemented to the patterned resist layer after the developing process. In one embodiment, an etching process is applied to the substrate to etch a material layer thereon through the openings of the patterned resist layer. In another embodiment, an ion implantation process is applied to the substrate, such as a silicon substrate, through the openings of the patterned resist layer. In either case, the patterned resist layer is used as a mask layer. The patterned resist layer is thereafter removed by a process, such as wet stripping or plasma ashing.

Although embodiments of the present disclosure have been described in detail, those skilled in the art should understand that they may make various changes, substitutions, and alterations herein without departing from the spirit and scope of the present disclosure. In one embodiment, the disclosed method is used to form one or more metal-oxide-semiconductor field-effect-transistors (MOSFETs) or other various features in an integrated circuit (IC).

Thus, the present disclosure provides a method of lithography patterning. The method includes coating a resist layer on a substrate; performing an exposing process to the resist layer using a lithography tool with a numerical aperture tuned between about 0.5 and about 0.6; thereafter baking the resist layer; thereafter performing a first developing process to the resist layer for a first period of time; and performing a second developing process to the resist layer for a second period of time.

In various embodiments of the disclosed method, the baking of the resist layer may include baking the resist layer in a temperature ranging between 135° C. and 150° C. The first period of time and second period of time each may be about 30 seconds. The sum of the first period of time and second period of time may be more than 50 seconds. The sum of the first period of time and second period of time may range between about 50 seconds and about 70 seconds. The performing of the first developing process includes applying a developing solution to the resist layer and thereafter applying a de-ionized water (DIW) to the resist layer. The resist layer may include a thickness more than about 25000 angstrom. The resist layer may include acid labile units such that the resist dissolving rate is reduced to a range between about 0.01 and about 0.05 nm/sec. The resist layer may include hydrophobic macromolecular buffer to restrain the photo acid reaction. The resist layer may include a bulky buffer loading level in a range between about 100% and about 175%.

The present disclosure also provides another embodiment of a lithography patterning method. The method includes coating on a substrate a resist layer having an increased acid labile unit ratio such that a resist dissolving rate is reduced to a range between about 0.01 and about 0.05 nm/sec; performing an exposing process to the resist layer using a lithography tool with a numerical aperture tuned between about 0.5 and about 0.6; thereafter baking the resist layer; and thereafter performing a two-cycle developing process to the resist layer with a total processing time more than about 50 seconds. In various embodiments, the resist layer may include hydrophobic macromolecular buffer to restrain the photo acid reaction. The resist layer may include a bulky buffer loading level in a range between about 100% and about 175%. The two-cycle developing process may include a first developing process for about 30 seconds; and a second developing process for about 30 seconds. The total processing time of the two cycle developing process may range between about 50 seconds and about 70 seconds. The baking of the resist layer may include baking the resist layer at a temperature ranging between about 135° C. and about 150° C.

The present disclosure also provides another embodiment of a method of lithography patterning. The method includes coating a resist layer on a substrate; performing an exposing process to the resist layer using a lithography tool with a numerical aperture tuned between about 0.5 and about 0.6; thereafter baking the resist layer at a temperature ranging between about 135° C. and about 150° C.; thereafter performing a first developing process to the resist layer for about 30 seconds; and performing a second developing process to the resist layer for about 30 seconds. In various embodiments, the resist layer may include acid labile units such that the resist dissolving rate is reduced to a range between about 0.01 and about 0.05 nm/sec. The resist layer may include hydrophobic macromolecular buffer to restrain the photo acid reaction. The resist layer may include a bulky buffer loading level in a range between about 100% and about 175%.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of lithography patterning, comprising:
    coating a resist layer on a substrate, wherein the resist layer comprises acid labile units such that a resist dissolving rate is between about 0.01 and about 0.05 nm/sec;
    performing an exposing process to the resist layer using a lithography tool with a numerical aperture tuned between about 0.5 and about 0.6;
    baking the resist layer;
    performing a first developing process to the resist layer for a first period of time; and
    performing a second developing process to the resist layer for a second period of time.

2. The method of claim 1, wherein the baking the resist layer comprises baking the resist layer at a temperature ranging between 135° C. and 150° C.

3. The method of claim 1, wherein the first period of time and second period of time each is about 30 seconds.

4. The method of claim 1, wherein the sum of the first period of time and second period of time is more than 50 seconds.

5. The method of claim 1, wherein the sum of the first period of time and second period of time ranges between about 50 seconds and about 70 seconds.

6. The method of claim 1, wherein the performing the first developing process comprises applying a developing solution to the resist layer and thereafter applying a de-ionized water (DIW) to the resist layer.

7. The method of claim 1, wherein the resist layer comprises a thickness more than about 25000 angstrom.

8. The method of claim 1, wherein the resist layer comprises hydrophobic macromolecular buffer to restrain a photo acid reaction.

9. The method of claim 1, wherein the resist layer comprises a bulky buffer loading level in a range between about 100% and about 175%.

10. A method of lithography patterning, comprising:
    coating on a substrate a resist layer having an increased acid labile unit ratio such that a resist dissolving rate is reduced to a range between about 0.01 and about 0.05 nm/sec;
    performing an exposing process to the resist layer using a lithography tool with a numerical aperture tuned between about 0.5 and about 0.6;
    baking the resist layer; and
    performing a two-cycle developing process to the resist layer with a total processing time of about 50 seconds or more.

11. The method of claim 10, wherein the resist layer comprises hydrophobic macromolecular buffer to restrain a photo acid reaction.

12. The method of claim 10, wherein the resist layer comprises a bulky buffer loading level in a range between about 100% and about 175%.

13. The method of claim 10, wherein the two-cycle developing process comprises
    a first developing process for about 30 seconds; and
    a second developing process for about 30 seconds.

14. The method of claim 10, wherein the total processing time of the two-cycle developing process ranges between about 50 seconds and about 70 seconds.

15. The method of claim 10, wherein the baking the resist layer comprises baking the resist layer at a temperature ranging between about 135° C. and about 150° C.

16. A method of lithography patterning, comprising:
coating a resist layer on a substrate, wherein the resist layer comprises acid labile units such that a resist dissolving rate is between about 0.01 and about 0.05 nm/sec;
performing an exposing process to the resist layer using a lithography tool with a numerical aperture tuned between about 0.5 and about 0.6;
baking the resist layer at a temperature ranging between about 135° C. and about 150° C.;
performing a first developing process to the resist layer for about 30 seconds; and
performing a second developing process to the resist layer for about 30 seconds.

17. The method of claim 16, wherein the resist layer comprises hydrophobic macromolecular buffer to restrain a photo acid reaction.

18. The method of claim 16, wherein the resist layer comprises a bulky buffer loading level in a range between about 100% and about 175%.

\* \* \* \* \*